US008807679B2

(12) United States Patent
Hoisington

(10) Patent No.: US 8,807,679 B2
(45) Date of Patent: Aug. 19, 2014

(54) DRIVING DROP EJECTORS

(75) Inventor: Paul A. Hoisington, Hanover, NH (US)

(73) Assignee: FUJIFILM Corporation, Tokyo (JP)

( * ) Notice: Subject to any disclaimer, the term of this patent is extended or adjusted under 35 U.S.C. 154(b) by 836 days.

(21) Appl. No.: 12/991,897

(22) PCT Filed: May 1, 2009

(86) PCT No.: PCT/US2009/042556
§ 371 (c)(1),
(2), (4) Date: Dec. 28, 2010

(87) PCT Pub. No.: WO2009/142897
PCT Pub. Date: Nov. 26, 2009

(65) Prior Publication Data
US 2011/0122182 A1    May 26, 2011

Related U.S. Application Data

(60) Provisional application No. 61/055,108, filed on May 21, 2008.

(51) Int. Cl.
B41J 29/38    (2006.01)
B41J 2/045    (2006.01)
H01L 41/09    (2006.01)

(52) U.S. Cl.
CPC .......... B41J 2/04588 (2013.01); H01L 41/0973 (2013.01); B41J 2/04541 (2013.01); B41J 2/04581 (2013.01); B41J 2/0455 (2013.01)
USPC .......................................................... 347/10

(58) Field of Classification Search
USPC .......................................................... 347/10
See application file for complete search history.

(56) References Cited

U.S. PATENT DOCUMENTS 4,950,919 A    8/1990    Rossi et al.
5,541,628 A    7/1996    Chang et al.
(Continued)

FOREIGN PATENT DOCUMENTS

JP    63-304715    12/1988
JP    07-137252    5/1995
(Continued)

OTHER PUBLICATIONS

International Search Report and Written Opinion dated Jun. 29, 2009 issued in international application No. PCT/US2009/042556, 9 pgs.
(Continued)

Primary Examiner — Uyen Chau N Le
Assistant Examiner — Hoang Tran
(74) Attorney, Agent, or Firm — Fish & Richardson P.C.

(57) ABSTRACT

Methods, systems, and apparatus, for drop ejection, specifically, for driving drop ejectors using n-type double-diffused metal oxide semiconductor (NDMOS) transistors with sputtered piezoelectric transducers. In general, in one aspect, an apparatus includes a n-type double-diffused metal oxide semiconductor transistor. The apparatus also includes a piezoelectric transducer. A first surface of the piezoelectric transducer is coupled to the n-type double-diffused metal oxide semiconductor transistor. The apparatus also includes a first waveform generator configured to generate an ejector waveform to apply to a second surface of the piezoelectric transducer. The ejector waveform includes at least a positive pulse and a negative pulse. The apparatus also includes a second waveform generator configured to generate a control waveform to apply to the n-type double-diffused metal oxide semiconductor transistor to selectively actuate the piezoelectric transducer.

13 Claims, 3 Drawing Sheets

(56) References Cited

U.S. PATENT DOCUMENTS

| | | | |
|---|---|---|---|
| 5,790,156 | A | 8/1998 | Mutton et al. |
| 6,354,686 | B1 | 3/2002 | Tanaka et al. |
| 6,382,754 | B1 * | 5/2002 | Morikoshi et al. .............. 347/11 |
| 6,476,442 | B1 | 11/2002 | Williams et al. |
| 2003/0231221 | A1 | 12/2003 | Samii |
| 2005/0162450 | A1 | 7/2005 | Sakurai |
| 2005/0237353 | A1 * | 10/2005 | Oomura et al. ................... 347/9 |
| 2006/0139412 | A1 | 6/2006 | Sakurai et al. |
| 2007/0115506 | A1 | 5/2007 | Yada |
| 2008/0020573 | A1 | 1/2008 | Birkmeyer et al. |

FOREIGN PATENT DOCUMENTS

| | | |
|---|---|---|
| JP | 2000-351212 | 12/2000 |
| JP | 2001-113734 | 4/2001 |
| JP | 2004-025868 | 1/2004 |
| JP | 2005-205770 | 8/2005 |
| JP | 2006-159780 | 6/2006 |
| JP | 2006-199580 | 8/2006 |
| JP | 2006199580 A * | 8/2006 |
| JP | 2007-203493 | 8/2007 |
| WO | 2009142897 | 11/2009 |

OTHER PUBLICATIONS

Office action mailed Jun. 24, 2013 in Japanese Patent Application No. 2011-510549 and partial translation, 6 pages.

International Preliminary Report on Patentability dated Dec. 2, 2010, issued in international application No. PCT/US2009/042556, 8 pgs.

Joseph F. Shepard, Jr. et al., "Characterization and aging response of the $d_{31}$ piezoelectric coefficient of lead zirconate titanate thin films", May 1, 1999, Journal of Applied Physics, vol. 85, No. 9, pp. 6711-6716.

* cited by examiner

DRIVING DROP EJECTORS

CROSS-REFERENCE TO RELATED APPLICATIONS

This application is the national stage of International Application Number PCT/US2009/042556, filed on May 1, 2009, which is based on and claims the benefit of the filing date of U.S. Provisional Application No. 61/055,108, filed on May 21, 2008, both of which as filed are incorporated herein by reference in their entireties.

BACKGROUND

This specification relates to drop ejection.

Some types of conventional inkjet printers use piezoelectrically-based drop ejectors to controllably eject drops of ink onto a medium (e.g., a sheet). Some drop ejector drivers use p-type double-diffused metal oxide semiconductor (PD-MOS) transistors or analog switches to selectively drive the drop ejectors. In some types of devices, the size of the transistors and the analog switches cause the drop ejector drivers to be too large to integrate into the available footprint for the drop ejectors. Thus, it can be desirable to find alternative ways to drive these types of devices.

SUMMARY

This specification describes technologies relating to drop ejection, and in specific implementations, to driving drop ejectors using n-type double-diffused metal oxide semiconductor (NDMOS) transistors with sputtered piezoelectric transducers.

In general, in one aspect, an apparatus includes a n-type double-diffused metal oxide semiconductor transistor. The apparatus also includes a piezoelectric transducer. A first surface of the piezoelectric transducer is coupled to the n-type double-diffused metal oxide semiconductor transistor. The apparatus also includes a first waveform generator configured to generate an ejector waveform to apply to a second surface of the piezoelectric transducer. The ejector waveform includes at least a positive pulse and a negative pulse. The apparatus also includes a second waveform generator configured to generate a control waveform to apply to the n-type double-diffused metal oxide semiconductor transistor to selectively actuate the piezoelectric transducer. Other implementations of this aspect include corresponding systems, methods, and computer program products.

These and other implementations can optionally include one or more of the following features. The first waveform generator is coupled to the second surface of the piezoelectric transducer, and the second waveform generator is coupled to the gate of the NDMOS transistor. The amplitude of the negative pulse is small enough to avoid ink discharge from a drop ejector driven by the piezoelectric transducer. The first surface of the piezoelectric transducer has a positive polarization. The gate of the NDMOS transistor is coupled to the second waveform generator. The drain of the NDMOS transistor is coupled to the first surface of the piezoelectric transducer. The source of the NDMOS transistor is coupled to ground. The NDMOS transistor includes an intrinsic diode. The anode of the intrinsic diode is coupled to the source of the NDMOS transistor, and the cathode of the intrinsic diode is coupled to the drain of the NDMOS transistor. The piezoelectric transducer has a $d_{31}$ coefficient having an absolute value greater than or equal to 200 pico-meters per volt.

In general, in another aspect, an apparatus includes a n-type double-diffused metal oxide semiconductor transistor. The apparatus also includes a piezoelectric transducer. A first surface of the piezoelectric transducer is coupled to the n-type double-diffused metal oxide semiconductor transistor and a second surface of the piezoelectric transducer is coupled to ground. The apparatus also includes a first waveform generator configured to generate an ejector waveform to apply to the n-type double-diffused metal oxide semiconductor transistor. The ejector waveform includes at least a positive pulse and a negative pulse. The apparatus also includes a second waveform generator configured to generate a control waveform to apply to the n-type double-diffused metal oxide semiconductor transistor to selectively actuate the piezoelectric transducer. Other implementations of this aspect include corresponding systems, methods, and computer program products.

These and other implementations can optionally include one or more of the following features. The first waveform generator is coupled to the source of the NDMOS transistor, and the second waveform generator is coupled to the gate of the NDMOS transistor. The amplitude of the negative pulse is small enough to avoid ink discharge from a drop ejector driven by the piezoelectric transducer. The first surface of the piezoelectric transducer has a positive polarization. The gate of the NDMOS transistor is coupled to the second waveform generator. The drain of the NDMOS transistor is coupled to the first surface of the piezoelectric transducer. The source of the NDMOS transistor is coupled to the first waveform generator. The NDMOS transistor includes an intrinsic diode. The anode of the intrinsic diode is coupled to the source of the NDMOS transistor, and the cathode of the intrinsic diode is coupled to the drain of the NDMOS transistor. The piezoelectric transducer has a $d_{31}$ coefficient having an absolute value greater than or equal to 200 pico-meters per volt.

In general, in another aspect, a method includes selectively actuating the piezoelectric transducer of the apparatuses above, using the ejector waveform and the control waveform to drive a drop ejector. Other implementations of this aspect include corresponding systems, apparatus, and computer program products.

In general, in another aspect, an apparatus includes a circuit. The circuit includes a n-type double-diffused metal oxide semiconductor transistor and a piezoelectric transducer. A first surface of the piezoelectric transducer is coupled to the n-type double-diffused metal oxide semiconductor transistor. The apparatus also includes a first waveform generator configured to generate a control waveform to apply to the n-type double-diffused metal oxide semiconductor transistor to selectively actuate the piezoelectric transducer. The apparatus also includes a second waveform generator configured to apply an ejector waveform across the circuit. The ejector waveform includes at least a positive pulse and a negative pulse. Other implementations of this aspect include corresponding systems, methods, and computer program products.

These and other implementations can optionally include one or more of the following features. The amplitude of the negative pulse is small enough to avoid ink discharge from a drop ejector driven by the piezoelectric transducer. The first surface of the piezoelectric transducer has a positive polarization. The gate of the NDMOS transistor is coupled to the first waveform generator. The drain of the NDMOS transistor is coupled to the first surface of the piezoelectric transducer. The source of the NDMOS transistor is coupled to ground. The gate of the NDMOS transistor is coupled to the first waveform generator. The drain of the NDMOS transistor is coupled to the first surface of the piezoelectric transducer.

The source of the NDMOS transistor is coupled to the second waveform generator. The NDMOS transistor includes an intrinsic diode. The anode of the intrinsic diode is coupled to the source of the NDMOS transistor, and the cathode of the intrinsic diode is coupled to the drain of the NDMOS transistor. The piezoelectric transducer has a $d_{31}$ coefficient having an absolute value greater than or equal to 200 pico-meters per volt.

Particular embodiments of the subject matter described in this specification can be implemented to realize none, one or more of the following advantages. Using NDMOS transistors with sputtered piezoelectric material to drive the transducers can allow the size of drop ejector drivers to be reduced. By reducing the size of the drivers, the drivers can be integrated into the drop ejectors. In particular, NDMOS transistors are smaller than some other types of switching devices that are used in drop ejector drivers. NDMOS transistors can use less silicon than the conventional switching devices (e.g., about half as much silicon as conventional PDMOS transistors, and less than half as much silicon as conventional analog switches). In addition, using thin film piezoelectric layers can allow the size of the drop ejector drivers to be reduced. Reducing the size of the drop ejector drivers can also reduce the costs (e.g., manufacturing cost) of the drop ejector drivers.

Furthermore, using bipolar pulses to actuate the sputtered piezoelectric material can reduce the required peak voltage across the NDMOS transistors in the drop ejector drivers. Bipolar pulses may also require a lower quiescent voltage and improve the frequency response of waveforms used to actuate the sputtered piezoelectric material, thereby improving the long term stability of the drop ejectors (e.g., because the uniformity of the velocity generated by the drop ejectors is improved).

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
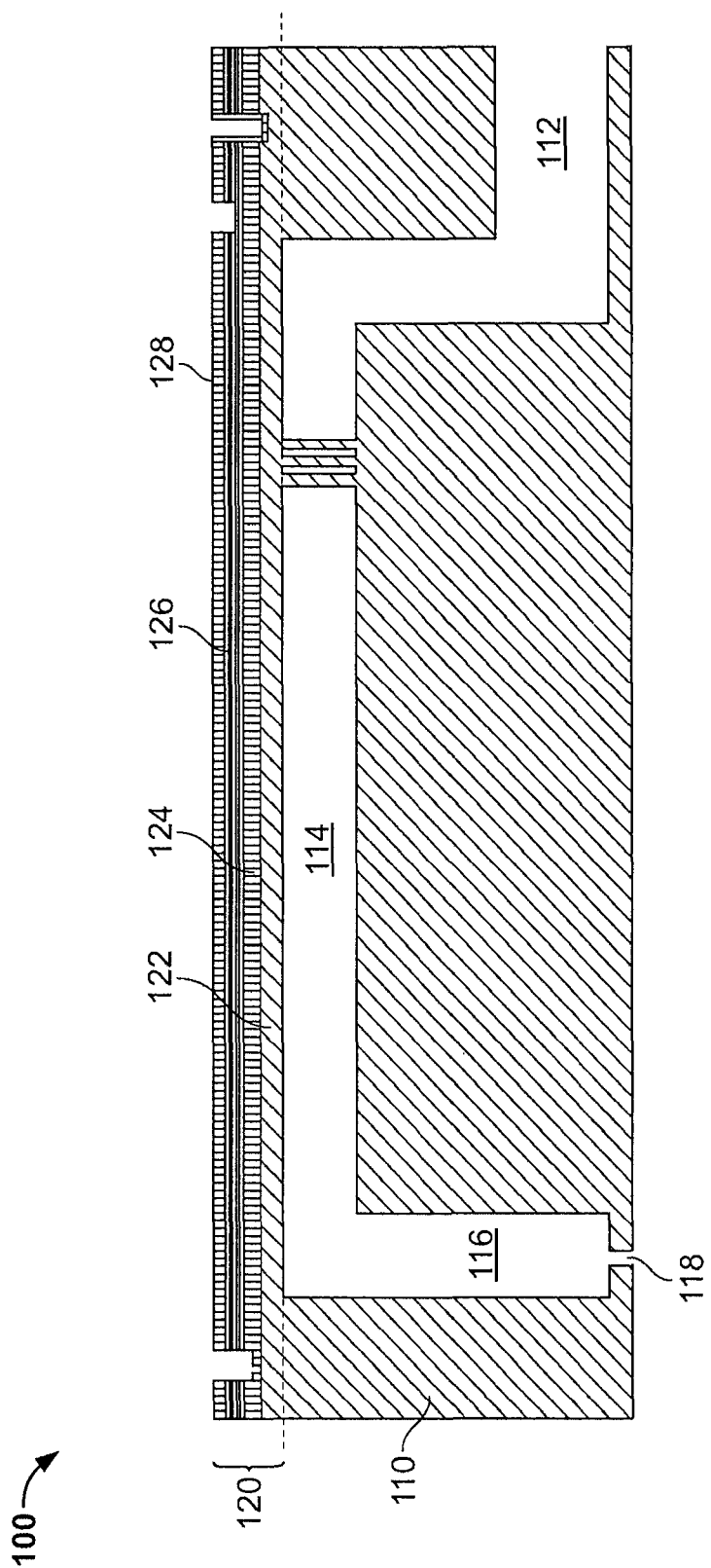
FIG. 1 is a schematic diagram of an exemplary droplet ejector unit in a fluid ejector.

FIG. 1 is a schematic diagram of an exemplary droplet ejector unit in a fluid ejector (e.g., a printhead module 100). The fluid to be ejected can be an ink, but other fluids, e.g., electroluminescent materials, biological compounds, or materials for formation of electrical circuits, can be jetted from the fluid ejector.

An inkjet printer (not shown) can include printhead units (not shown), and the printhead unit can include multiple droplet ejector units (only one is illustrated in FIG. 1). The printhead units can include printhead modules 100 that can controllably eject drops of ink on a sheet, or a portion of the sheet, to print an image. For example, the image can be printed by selectively jetting ink from the printhead units as the inkjet printhead and the sheet move relative to one another.

The printhead module 100 includes a module substrate 110 and a piezoelectric actuator structure 120 (e.g., an actuator including lead zirconium titanate ("PZT") or another piezoelectric material, and electrodes). The module substrate 110 can be a monolithic semiconductor body such as a silicon substrate. The module substrate 110 can include an actuator membrane 122. In some implementations, the actuator membrane 122 can also be a part of the piezoelectric actuator structure 120. For each droplet ejector unit, passages through the silicon substrate define a flow path for the fluid to be ejected, e.g., ink. Each flow path can include an ink inlet 112, a pumping chamber 114, and a nozzle 118. A piezoelectric actuator structure 120 is positioned over the pumping chamber 114. Ink flows through the ink inlet 112 to the pumping chamber 114, where, when a voltage pulse is applied across a piezoelectric material in the piezoelectric actuator structure 120, the ink is pressurized such that it is directed to a descender 116 and out of the nozzle 118. These etched features can be configured in a variety of ways.

The piezoelectric actuator structure 120 includes a ground electrode layer 124, a piezoelectric layer 126, and a drive electrode layer 128. The piezoelectric layer 126 is a thin film of piezoelectric material. For example, the thin film can range in thickness from 1 to 25 microns. The piezoelectric layer 126 can be composed of a piezoelectric material that has desirable properties such as high density, low voids, and high piezoelectric coefficients. The actuator membrane can be formed from silicon.

In some implementations, the thin film of piezoelectric material is deposited by sputtering. Types of sputter deposition can include magnetron sputter deposition (e.g., RF sputtering), ion-beam sputtering, reactive sputtering, ion-assisted deposition, high-target-utilization sputtering, and high power impulse magnetron sputtering. Sputtered piezoelectric material (e.g., piezoelectric thin film) can have a large as-deposited polarization. Some types of chambers that are used for sputtering piezoelectric material apply a direct current (DC) field during sputtering. The DC field causes the piezoelectric material to be polarized in the orientation that results when a negative voltage is applied to the exposed side of the piezoelectric material.

Piezoelectric coefficients can be used as a measure of polarization. Piezoelectric coefficients (e.g., "d" coefficients) of thin films relate to the strain of a piezoelectric material produced by an applied electrical field. In particular, a transverse piezoelectric coefficient $d_{31}$ relates the strain of the piezoelectric material perpendicular to the polarization axis to the electric field that is applied to the piezoelectric material parallel to the polarization axis. A sputtered piezoelectric material can have a $d_{31}$ absolute value greater than or equal to about 100 pico-meters per volt, e.g., greater than or equal to about 200 pico-meters per volt. For example, a sputtered piezoelectric material can have a $d_{31}$ absolute value of about 225 to 250 pico-meters per volt.

The piezoelectric layer 126 with the ground electrode layer 124 on one side is fixed to the actuator membrane 122. The actuator membrane 122 isolates the ground electrode layer 124 and the piezoelectric layer 126 from ink in the pumping chamber 114. The actuator membrane 122 can be silicon and has a compliance selected so that actuation of the piezoelectric layer 126 causes flexing of the actuator membrane 122 that is sufficient to pressurize fluid in the pumping chamber 114.

The piezoelectric layer 126 changes geometry, or bends, in response to an applied voltage (e.g., a voltage applied at the drive electrode layer 128). The bending of the piezoelectric layer 126 pressurizes fluid in the pumping chamber 114 to controllably force ink through the descender 116 and eject drops of ink out of the nozzle 118.

Figure 2A:
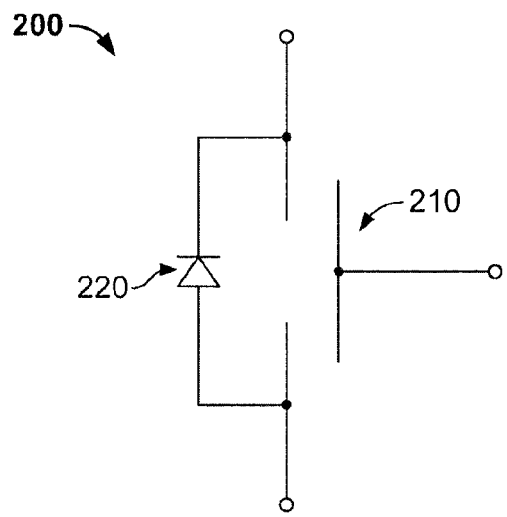
FIG. 2A is a schematic diagram of an exemplary circuit for driving a droplet ejector unit of a printhead module.

FIG. 2A is a schematic diagram of an exemplary circuit 200 for driving a droplet ejector unit of a printhead module (e.g., the printhead module 100). In some implementations, the circuit is external to the printhead module. In some implementations, the circuit is integrated into the printhead module. In particular, the circuit 200 is a circuit schematic of a NDMOS transistor. The circuit 200 includes a transistor 210 coupled to a diode 220 (e.g., an intrinsic diode of the NDMOS transistor). The anode of the diode 220 is coupled to the source of the transistor 210, and the cathode of the diode 220 is coupled to the drain of the transistor 210. The source, gate, and drain of the transistor 210, correspond to the source, gate, and drain, respectively, of the NDMOS transistor.

In some implementations, one or more instances of circuit 200 can be fabricated on an integrated circuit element, e.g., one per fluid ejector unit to be controlled by the integrated circuit element. For example, the integrated circuit element can be attached to a die that includes greater than or equal to 1,024 nozzles. The die can be, for example, in the shape of a parallelogram that includes sides with dimensions of about 15 millimeters and 45 millimeters. In some alternative implementations, because the size of the circuit 200 can be reduced, the circuit 200 can be integrated directly onto the die.

Because the current between the drain and source of a transistor is limited by the voltage at the gate of the transistor, the transistor can be used as a switch. In particular, the circuit 200 is used as a switch to controllably actuate a piezoelectric actuator structure to drive a printhead module. In addition, the voltage applied to the gate of the transistor 210 can also be used to limit the current through the drain of the transistor 210.

Figure 2B:
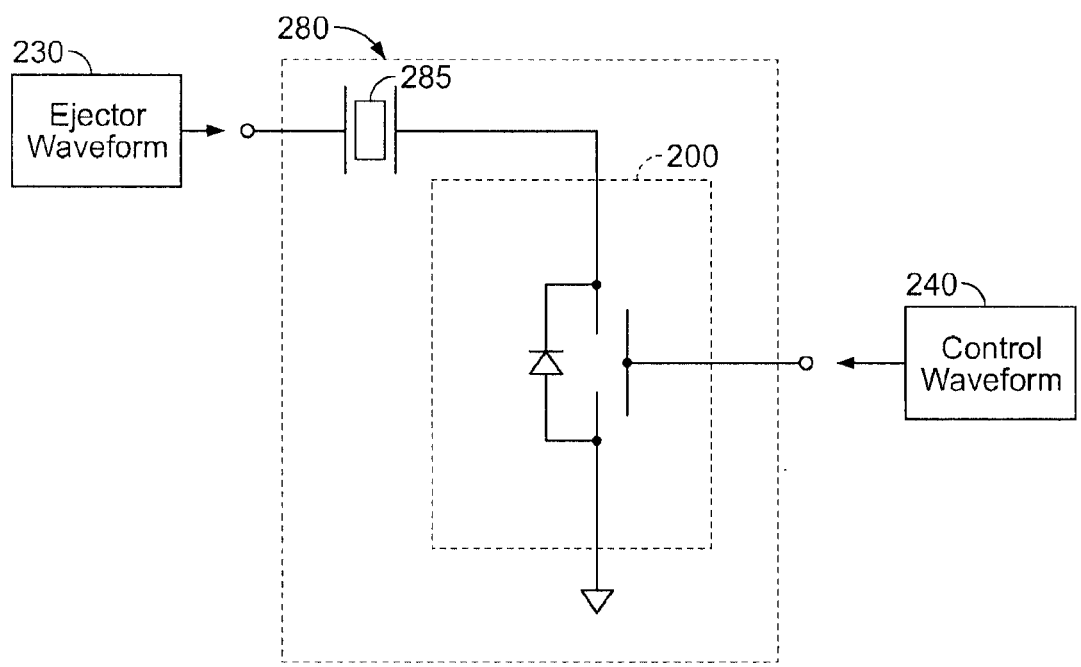
FIG. 2B is a schematic diagram that includes an exemplary printhead module driver.

FIG. 2B is a schematic diagram that includes an exemplary printhead module driver 280. The printhead module driver 280 includes the circuit 200 and a piezoelectric actuator structure 285 (e.g., a PZT). In some implementations, the drain of the transistor 210 is coupled to the piezoelectric actuator structure 285 (e.g., at the drive electrode layer 128 of the piezoelectric actuator structure 120 as shown in FIG. 1). The drain of the transistor 210 can be coupled to the electrode on a surface of the piezoelectric actuator structure 285 that had a negative voltage applied to it during poling (e.g., the surface of the piezoelectric transducer that has a positive polarization). This coupling facilitates over current detection. The other electrode of the piezoelectric actuator structure 285 (e.g., the ground electrode 124) is further coupled to a waveform generator 230 configured to generate an ejector waveform. The gate of the transistor 210 is coupled to a waveform generator 240 configured to generate a control waveform. The source of the transistor 210 is coupled to ground.

Figure 2C:
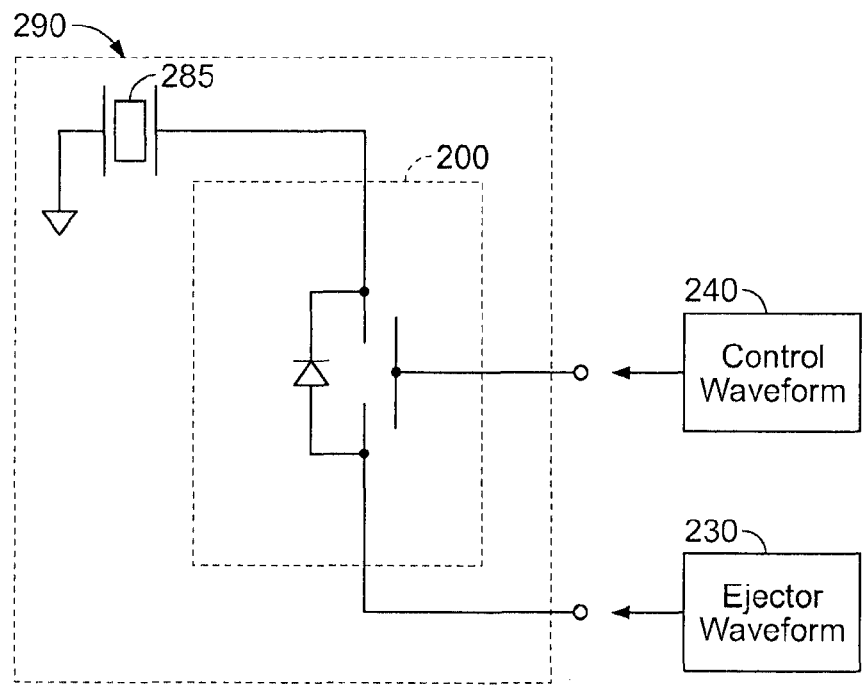
FIG. 2C is a schematic diagram that includes another exemplary printhead module driver.

FIG. 2C is a schematic diagram that includes another exemplary printhead module driver 290. The printhead module driver 290 includes the circuit 200 and a piezoelectric actuator structure 285. In some implementations, the drain of the transistor 210 is coupled to one electrode of the piezoelectric actuator structure 285 (e.g., at the drive electrode layer 128 of the piezoelectric actuator structure 120). The other electrode of the piezoelectric actuator structure 285 is further coupled to ground (e.g., at the ground electrode layer 124 of the piezoelectric actuator structure 120). The gate of the transistor 210 is coupled to the waveform generator 240 configured to generate a control waveform. The source of the transistor 210 is coupled to the waveform generator 230 configured to generate an ejector waveform.

Thus, in FIGS. 2B and 2C, droplet ejection from different nozzles can be individually controlled by applying different control waveforms to the individual circuits 200 for each fluid ejector unit. However, the same ejection waveform can be applied to each fluid ejector unit.

Figure 3:
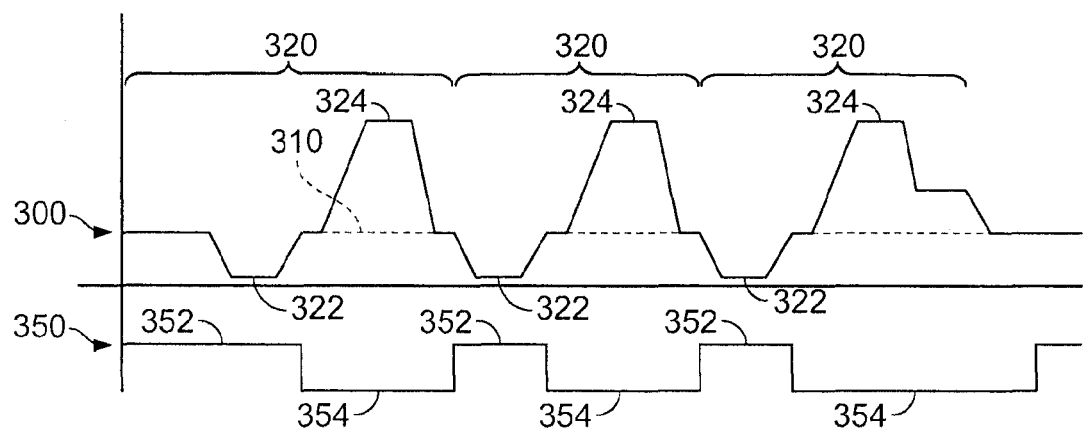
FIG. 3 is a diagram of exemplary ejector waveforms and an exemplary control waveform.

FIG. 3 is a diagram of exemplary ejector waveforms 300 and 310 and an exemplary control waveform 350. In particular, the ejector waveform 300 is experienced by printhead modules that are in the on condition (e.g., printhead modules that are selected to fire). The ejector waveform 310 is experienced by printhead modules that are in the off condition (e.g., printhead modules that are not selected to fire). The ejector waveform 310 can be substantially the same as the ejector waveform 300, except during a positive pulse 324 of the ejector waveform 300 (e.g., as represented by the dotted line of ejector waveform 310 in FIG. 3). During a positive pulse 324 of the ejector waveform 300, the ejector waveform 310 can be at a lower voltage than the ejector waveform 300. For example, the ejector waveform 310 can be at a reference voltage (e.g., a quiescent voltage). In some implementations (e.g., the implementation of FIG. 2B), the ejector waveform 300 and the control waveform 350 are applied to a piezoelectric actuator structure to produce acceptable drop ejection by the printhead modules. In some implementations (e.g., the implementation of FIG. 2C), the ejector waveform 300 is inverted and the inverted ejector waveform and the control waveform 350 are applied to the source of an NDMOS transistor to produce acceptable drop ejection by the printhead modules.

The ejector waveform 300 can include one or more firing pulses 320. In some implementations, the firing pulses 320 of the ejector waveform 300 are bipolar pulses. A bipolar pulse includes a negative pulse 322 and a positive pulse 324. The negative pulse 322 is a pulse with voltages that are less than a reference voltage (e.g., a quiescent voltage). The positive pulse 324 is a pulse with voltages that are greater than the reference voltage. In some implementations, the reference voltage is about one third of the operating voltage of the ejector. For example, if the operating voltage of the ejector is 20V, then the reference voltage can be about 7V. The positive pulse 324 causes the piezoelectric actuator structure to contract the pumping chamber to eject ink.

The negative pulse 322 can be used to expand a pumping chamber so that it can be filled with ink. During the negative pulse 322, a drive current is pulled out of an application specific integrated circuit (e.g., the circuit 200). The drive current creates a voltage at the piezoelectric actuator structure that expands the pumping chamber. Because the drive current conducts through the intrinsic diode of an NDMOS transistor, the printhead modules will have a negative pulse applied to the piezoelectric actuator whether or not the gate voltage is high. Therefore, the negative pulse should have an amplitude small enough to avoid causing ink discharge (e.g., drop ejection or oozing) from printhead modules that are in the off condition.

Optionally, the flat component between the negative pulse and the following positive pulse allows the NDMOS transistors to turn off. However, the flat component is not required if the printhead module drivers can be turned off with enough accuracy so that the voltage uncertainty in the printhead modules in the off condition is small (e.g., about 1 volt). In addition, the flat component between the positive pulse and the following negative pulse is not required. In particular, the flat component does not affect printhead modules in the on condition, and the flat component is not required for printhead modules in the off condition because the diode will turn on automatically (e.g., forward bias).

In some implementations, a control waveform 350 includes high components 352 and low components 354. The high components 352 and low components 354 can be applied to the circuit 200 of FIG. 2A. The high components 352 can turn on the printhead modules because the gates of the transistors 210 are high. The high components 352 allow the printhead modules that are not selected to fire to conduct current during the rising edge of a negative pulse 322. Without the use of high components 352 of a control waveform 350, a voltage would develop across the NDMOS transistor during the rising edge of a negative pulse 322 that would persist to the end of the ejector waveform 300. The control waveform 350 can be used to discharge the voltage before a printhead module is selected to fire.

The high components 352 are applied to the transistor 210 to enable corresponding components of the ejector waveform 300 to actuate the piezoelectric actuator structure. The low components 354 are applied to the transistor 210 to prevent the ejector waveform 300 from actuating the piezoelectric actuator structure. In some implementations, the low components 354 can be zero volts. In some implementations, the low components 354 can be greater than zero volts if the low components 354 can cause the piezoelectric actuator structure 285 to experience negative pulses that are small enough in amplitude to avoid ink discharge from the printhead modules that are not selected to fire.

In particular, the control waveform 350 can be used to selectively turn on the NDMOS transistor. The control waveform 350 can prevent the diode 220 from rectifying a current and producing a net voltage across the NDMOS transistor.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. An apparatus comprising:
    a n-type double-diffused metal oxide semiconductor (NDMOS) transistor comprising a gate, a drain, a source, and an intrinsic diode;
    a piezoelectric transducer, a first surface of the piezoelectric transducer having a positive polarization and being coupled to the n-type double-diffused metal oxide semiconductor transistor;
    a first waveform generator coupled to a second surface of the piezoelectric transducer and configured to generate an ejector waveform to apply to the second surface of the piezoelectric transducer, where the ejector waveform includes at least a positive pulse and a negative pulse, and where an amplitude of the negative pulse is small enough to avoid ink discharge from a drop ejector driven by the piezoelectric transducer; and
    a second waveform generator coupled to the gate of the NDMOS transistor and configured to generate a control waveform to apply to the n-type double-diffused metal oxide semiconductor transistor to selectively actuate the piezoelectric transducer, where the piezoelectric transducer receives a negative voltage through the intrinsic diode of the NDMOS transistor whether or not a voltage of the gate is high.

2. The apparatus of claim 1, where the drain of the NDMOS transistor is coupled to the first surface of the piezoelectric transducer, and the source of the NDMOS transistor is coupled to ground.

3. The apparatus of claim 1, where the anode of the intrinsic diode is coupled to the source of the NDMOS transistor, and the cathode of the intrinsic diode is coupled to the drain of the NDMOS transistor.

4. The apparatus of claim 1, where the piezoelectric transducer has a $d_{31}$ coefficient having an absolute value greater than or equal to 200 pico-meters per volt.

5. A method comprising:
    coupling a n-type double-diffused metal oxide semiconductor (NDMOS) transistor to a first surface of a piezoelectric transducer, the NDMOS transistor comprising a gate, a drain, a source, and an intrinsic diode, the first surface of the piezoelectric transducer having a positive polarization;
    coupling a first waveform generator to the second surface of the piezoelectric transducer, where the first waveform generator is configured to generate an ejector waveform to apply to the second surface of the piezoelectric transducer, the ejector waveform includes at least a positive pulse and a negative pulse, and an amplitude of the negative pulse is small enough to avoid ink discharge from a drop ejector driven by the piezoelectric transducer; and
    coupling a second waveform generator to the gate of the n-type double-diffused metal oxide semiconductor transistor, where the second waveform generator is configured to generate a control waveform to apply to the n-type double-diffused metal oxide semiconductor transistor to selectively actuate the piezoelectric transducer, and where the piezoelectric transducer receives a negative voltage through the intrinsic diode of the NDMOS transistor whether or not a voltage of the gate is high.

6. The method of claim 5, where the drain of the NDMOS transistor is coupled to the first surface of the piezoelectric transducer, and the source of the NDMOS transistor is coupled to ground.

7. The method of claim 5, where the anode of the intrinsic diode is coupled to the source of the NDMOS transistor, and the cathode of the intrinsic diode is coupled to the drain of the NDMOS transistor.

8. The method of claim 5, where the piezoelectric transducer has a $d_{31}$ coefficient having an absolute value greater than or equal to 200 pico-meters per volt.

9. A method for using the apparatus of claim 1, comprising:
selectively actuating the piezoelectric transducer using the ejector waveform and the control waveform to drive a drop ejector.

10. An apparatus comprising:
a circuit including:
a n-type double-diffused metal oxide semiconductor (NDMOS) transistor comprising a gate, a drain, a source, and an intrinsic diode, and
a piezoelectric transducer, a first surface of the piezoelectric transducer having a positive polarization and being coupled to the n-type double-diffused metal oxide semiconductor transistor;
a second waveform generator coupled to the gate of the NDMOS transistor and configured to generate a control waveform to apply to the n-type double-diffused metal oxide semiconductor transistor to selectively actuate the piezoelectric transducer, and where the piezoelectric transducer receives a negative voltage through the intrinsic diode of the NDMOS transistor whether or not a voltage of the gate is high; and
a first waveform generator coupled to a second surface of the piezoelectric transducer and configured to apply an ejector waveform across the circuit, where the ejector waveform includes at least a positive pulse and a negative pulse, and where an amplitude of the negative pulse is small enough to avoid ink discharge from a drop ejector driven by the piezoelectric transducer.

11. The apparatus of claim 10, where the drain of the NDMOS transistor is coupled to the first surface of the piezoelectric transducer, and the source of the NDMOS transistor is coupled to ground.

12. The apparatus of claim 10, where the anode of the intrinsic diode is coupled to the source of the NDMOS transistor, and the cathode of the intrinsic diode is coupled to the drain of the NDMOS transistor.

13. The apparatus of claim 10, where the piezoelectric transducer has a $d_{31}$ coefficient having an absolute value greater than or equal to 200 pico-meters per volt.

* * * * *